United States Patent
Hendrix et al.

(10) Patent No.: US 7,460,847 B2
(45) Date of Patent: Dec. 2, 2008

(54) HANDHELD AUDIO SYSTEM WITH RADIO RECEIVER AND METHOD FOR USE THEREWITH

(75) Inventors: Jon David Hendrix, Wimberley, TX (US); Thomas Glen Ragan, Austin, TX (US); Michael R. May, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 469 days.

(21) Appl. No.: 11/217,763

(22) Filed: Sep. 1, 2005

(65) Prior Publication Data
US 2007/0049230 A1    Mar. 1, 2007

(51) Int. Cl.
*H04B 1/16* (2006.01)
*H04Q 7/20* (2006.01)

(52) U.S. Cl. ..................... 455/212; 455/219

(58) Field of Classification Search ......... 455/212–213, 455/217–225, 245.1, 253.2
See application file for complete search history.

(56) References Cited

U.S. PATENT DOCUMENTS

| | | | |
|---|---|---|---|
| 4,041,390 A * | 8/1977 | Schroeder | 455/83 |
| 4,761,829 A * | 8/1988 | Lynk et al. | 455/307 |
| 6,374,095 B1 * | 4/2002 | Doyle et al. | 455/218 |
| 2003/0162518 A1 * | 8/2003 | Baldwin et al. | 455/253.2 |

\* cited by examiner

*Primary Examiner*—Lee Nguyen
(74) *Attorney, Agent, or Firm*—Toler Law Group (57) ABSTRACT

A radio receiver, optionally used in conjunction with a handheld audio system, includes a radio stage for processing a received radio signal into an audio signal. An audio stage produces an audio output, based on the audio signal. An overload monitor detects an overload condition in the radio stage and generates an overload signal in response to the detected overload condition. A controller controls the audio output in response to the overload signal.

30 Claims, 7 Drawing Sheets

HANDHELD AUDIO SYSTEM WITH RADIO RECEIVER AND METHOD FOR USE THEREWITH

TECHNICAL FIELD OF THE INVENTION

The present invention relates to radio receivers as may be used in personal audio equipment, and related methods.

DESCRIPTION OF RELATED ART

As is known, integrated circuits are used in a wide variety of electronic equipment, including portable, or handheld, devices. Such handheld devices include personal digital assistants (PDA), CD players, MP3 players, DVD players, AM/FM radio, a pager, cellular telephones, computer memory extension (commonly referred to as a thumb drive), etc. Each of these handheld devices includes one or more integrated circuits to provide the functionality of the device. As an example, a handheld FM radio receiver may include multiple integrated circuits to support the reception and processing of broadcast radio signals in order to produce an audio output that is delivered to the user through speakers, headphones or the like.

As is known in the art, various circuit components can be implemented using 0.35 micron or smaller CMOS technology. These integrated circuits operate using relatively low power and with relatively low power supply voltages. These are desirable features of a handheld device. However, this low power implementation can limit the maximum input voltage that a device can process. The radio frequency (RF) amplifiers in these devices typically employ automatic gain control (AGC) circuitry in order to control the input signal level within desired limits. The presence of the receiver in close proximity to an RF source that is transmitting within the passband of the receiver may nonetheless produce input signal voltages that can saturate the input components and provide a distorted audio output.

The need exists for a radio receiver that can be implemented efficiently on an integrated circuit, and that can compensate for the presence of strong RF signals on the input.

DETAILED DESCRIPTION OF THE INVENTION INCLUDING THE PRESENTLY PREFERRED EMBODIMENTS

Figure 1:
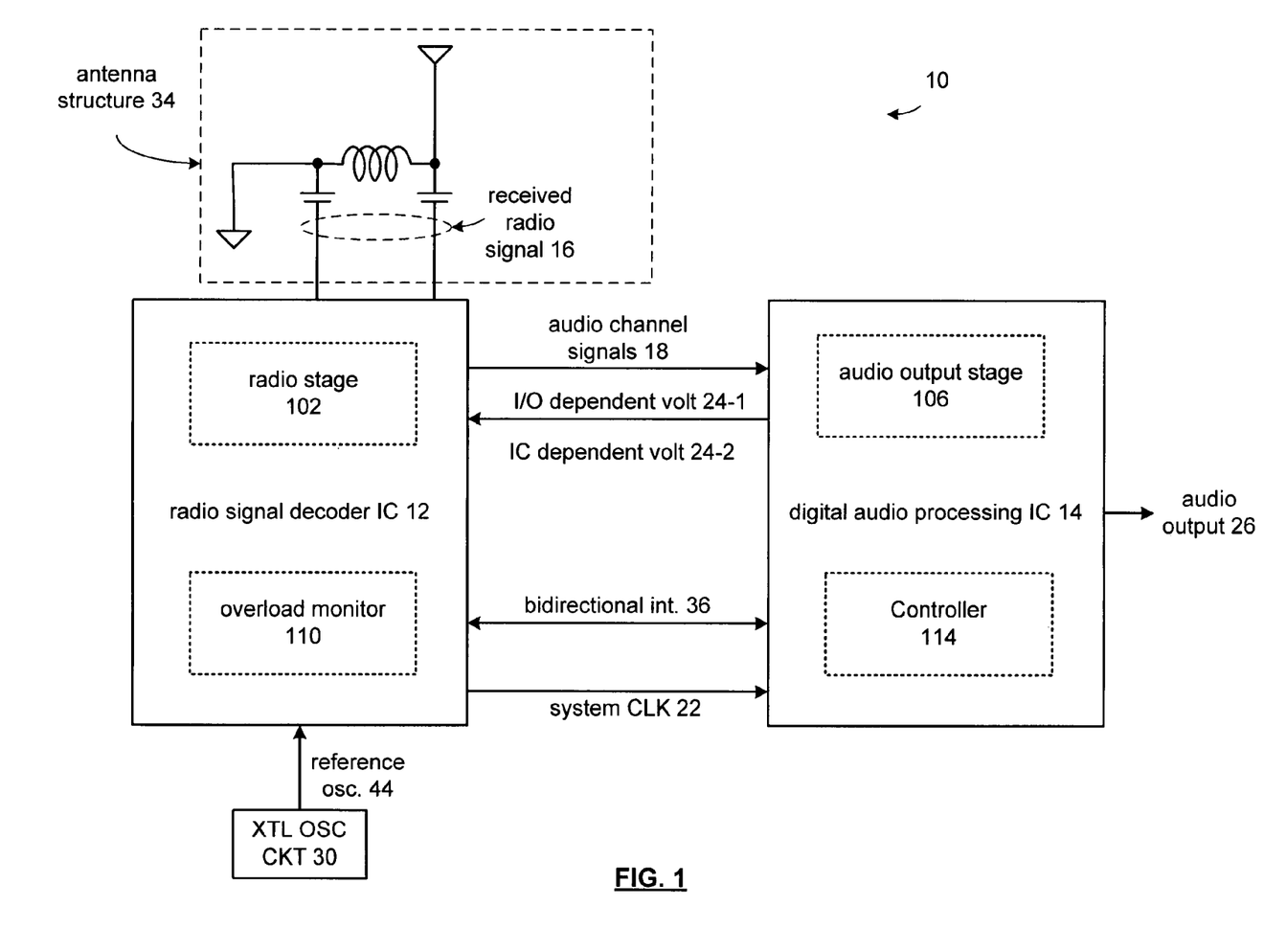
FIG. 1 presents a schematic block diagram of a handheld audio system in accordance with an embodiment of the present invention.

FIG. 1 presents a schematic block diagram of a handheld audio system in accordance with an embodiment of the present invention. In particular, a schematic block diagram of a handheld audio system 10 is presented that includes a radio signal decoder integrated circuit 12 and a digital audio processing integrated circuit 14. The digital audio processing integrated circuit 14 includes memory, and a DC-to-DC converter. The digital audio processing integrated circuit 14 further includes a processing module that may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. Further note that, the memory stores, and the processing module executes, operational instructions corresponding to at least some of the steps and/or functions illustrated in the Figures that follow.

In this embodiment, the radio signal decoder integrated circuit 12 is operably coupled to a crystal oscillator circuit 30 and an antenna structure 34. The crystal oscillation circuit 30 is operably coupled to a crystal and produces therefrom a reference oscillation 44. The antenna structure 34 includes an antenna, a plurality of capacitors and an inductor coupled as shown. The received radio signal 16, which may be an AM radio signal, FM radio signal, satellite radio signal, cable radio signal, is provided from the antenna structure 34 to the radio signal decoder integrated circuit 12.

The radio signal decoder integrated circuit 12 includes a radio stage 102 that performs the function of radio signal decoding. Radio stage 102 converts the received radio signal 16, into two audio channel signals 18 (e.g., a digital stereo signal), which may include a Left+Right signal and a Left−Right signal. The radio signal decoding IC 12 provides the two audio channel signals 18 to the digital audio processing IC 14. Note that the two audio channel signals 18 may be digital signals or analog signals.

The digital audio processing integrated circuit 14 includes an audio output stage 106 that receives the two audio channel signals 18 and produces therefrom audio output 26. The digital audio processing IC 14 may provide the audio output 26 to a headphone set or other type of speaker output. As an alternative to producing the audio output 26 from the two audio channel signals 18, the digital audio processing integrated circuit 14 process stored MP3 files, stored WMA files, and/or other stored digital audio files to produce the audio output 26.

In an embodiment of the present invention, the digital audio processing integrated circuit 14, via a DC-DC converter, generates an input/output (I/O) dependent supply voltage 24-1 and an integrated circuit (IC) dependent voltage 24-2 that are supplied to the radio signal decoder IC 12. In one embodiment, the I/O dependent voltage 24-1 is dependent on the supply voltage required for input/output interfacing of the radio signal decoder IC and/or the digital audio processing IC 14 (e.g., 3.3 volts) and the IC dependent voltage 24-2 is dependent on the IC process technology used to produce integrated circuits 12 and 14. In alternative embodiments, other structures and methods for supplying power to and from integrated circuits 12 and 14 may be employed within the broad scope of the present invention.

The interface between the integrated circuits 12 and 14 further includes a bi-directional interface 36. Such an interface may be a serial interface for the integrated circuits 12 and 14 to exchange control data and/or other type of data. In one embodiment, the bi-directional interface 36 may be one or more serial communication paths that are in accordance with the I²C serial transmission protocol. As one of ordinary skill in the art will appreciate, other serial transmission protocols may be used for the bi-directional interface 36 and the bi-directional interface 36 may include one or more serial transmission paths.

Radio signal decoder integrated circuit 12 further includes an overload detector 110 for detecting an overload condition in the radio stage 102 and generating an overload signal in response to the detected overload condition that is transmitted to controller 114 of digital audio processing integrated circuit 14 via bidirectional interface 36. Controller 114, in turn, controls the audio output in response to the overload signal.

In an embodiment of the present invention, controller 114 is implemented as a series of operation instructions running on the processor of digital audio processing IC 14. In an embodiment, the controller 114 mutes the audio output 26 in response to a detected overload signal. In this fashion, the audio output 26, which is presumably distorted due to the overload condition in radio stage 102, is muted to provide the user a more pleasant auditory experience. In an embodiment of the present invention, the digital audio processing IC 14 includes at least one filter having at least one filter parameter. In this embodiment the muting of the audio output 26 can be implemented by modifying the at least one filter parameter, such as by replacing the filter parameter with a value of zero so as to force the output of the filter to be zero during the period the audio output is muted. The muting of the audio output 26 can be accomplished in other ways as well. For instance, the audio output stage 102 can be disabled or the audio output can be disconnected for the period of time that the audio output is muted.

In an alternative embodiment, the controller 114 attenuates the signal strength (or volume) of the audio output 26 in response to the overload signal a fixed amount, (e.g. 20 dB, 40 dB or 60 dB), rather than completely muting audio output 26. In this embodiment, the user experiences a distorted output, at a reduced volume, and therefore may perceive that the receiver is in a noisy environment, and not malfunctioning. In this embodiment the attenuation of the audio output 26 can be implemented by modifying at least one filter parameter of digital audio processing IC 14, such as by replacing the filter parameter with a reduced value so as to attenuate the audio output 26. The attenuation of the audio output 26 can be accomplished in other ways as well. For instance, an attenuator can be switched into the audio processing path for the period of time that the audio output 26 is attenuated.

In an embodiment of the present invention, the controller 114 tapers the muting (or attenuating) of the audio output 26 as the muting or attenuation is switched on, and as the muting or attenuation is switched off. This tapering avoids unpleasant pops and/or other audio artifacts that could otherwise be produced.

In an embodiment of the present invention, once the controller 114 mutes or attenuates the audio output 26, the mute (or attenuation) is continued for a predetermined period of time (e.g. ½ second, 1 second, 4 seconds). This embodiment can provide a more pleasant alternative to the user than switching between a muted (or attenuated) condition and a non-muted (or non-attenuated condition) in the event that the received radio stage 102 is rapidly alternating between an overload condition and a non-overload condition.

In a further embodiment, the controller 114 attenuates the audio output 26 an amount that is based on the magnitude of the overload signal. In this fashion, the attenuation can increase as the overload condition becomes more severe and corresponding distortion in the audio output 26 becomes more severe.

Further functions and features of the invention will be discussed in the Figures that follow.

Figure 2:
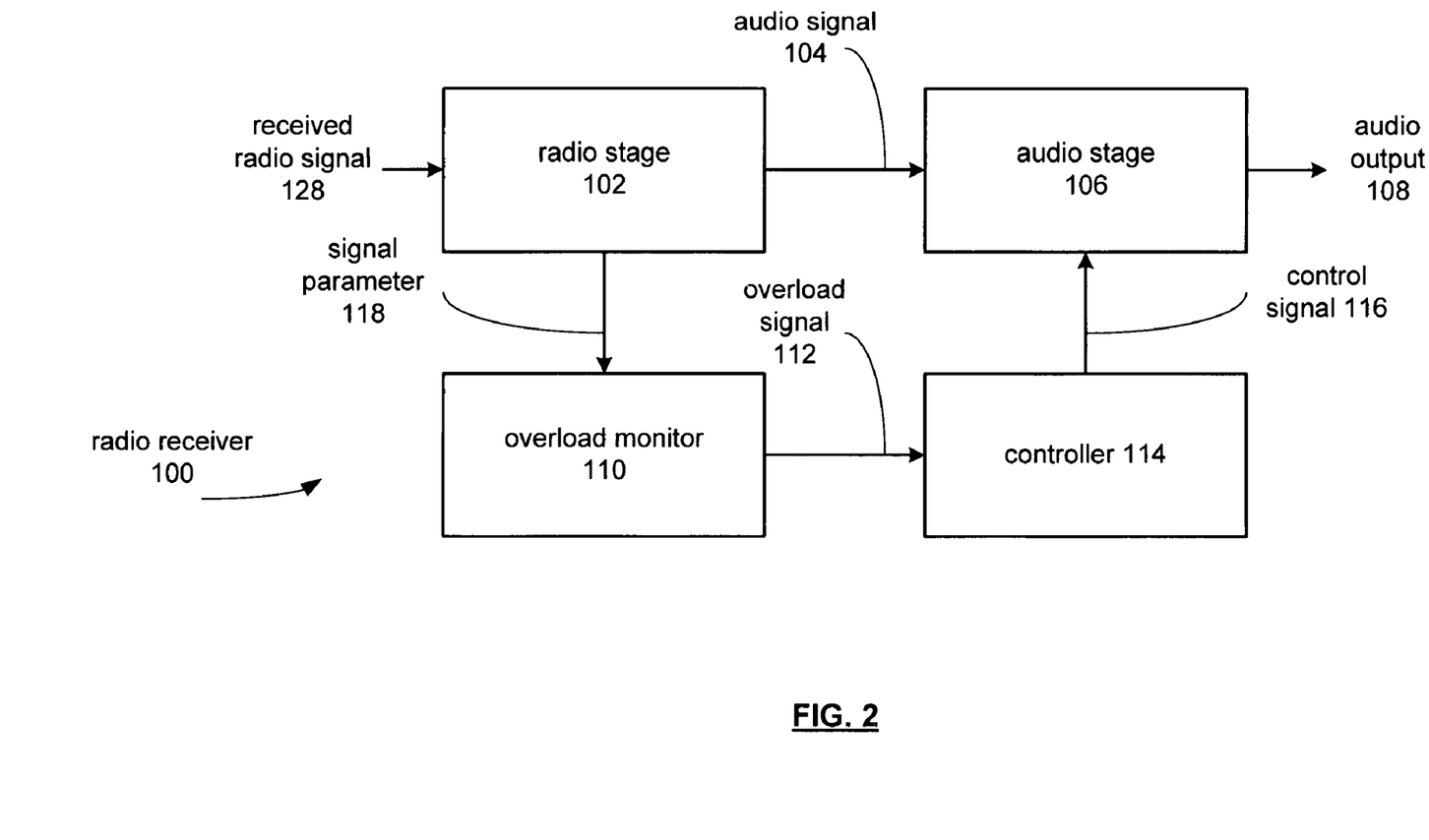
FIG. 2 presents a block diagram representation of a radio receiver in accordance with an embodiment of the present invention.

FIG. 2 presents a block diagram representation of a radio receiver in accordance with an embodiment of the present invention. In particular, further functions and features of the invention will be discussed in terms of a more generalized radio receiver 100. Radio receiver 100 includes a radio stage 102 for processing a received radio signal 128, such as received radio signal 16 described in conjunction with FIG. 1, into an audio signal 104. Audio stage 106 is operably coupled to the radio stage for producing an audio output 108, such as audio output 26 described in conjunction with FIG. 1. An overload monitor 110 is operably coupled to the radio stage 102 for detecting an overload condition in the radio stage 102 and for generating an overload signal 112 in response to the detected overload condition. A controller 114 is operably coupled to the overload monitor 110 and the audio stage 106 for controlling the audio output 108 in response to the overload signal 112.

In an embodiment of the present invention the overload monitor 110 measures an analog signal parameter 118 from the radio stage 102. In an embodiment of the present invention, the signal parameter 118 is an analog signal parameter proportional to the root mean square (RMS) voltage output from an RF amplifier implemented at the input of radio stage 102. However, in alternative embodiments, other analog, digital and discrete-time signals that represent signal parameters can likewise be employed such as other voltages, currents, powers, a received signal strength indication (RSSI), a harmonic or intermodulation distortion measurement, a saturation level, or other parameters indicative of an overload condition in the RF amplifier, mixer or other component(s) of radio stage 102.

In an embodiment of the present invention, overload signal 112 is a digital signal that, in accordance with the embodiment of FIG. 1, is transmitted over bidirectional interface 36. In circumstances where signal parameter 118 is an analog signal parameter, overload monitor 110 includes an analog to digital (A/D) converter for converting the analog signal parameter into a digital overload signal. In an alternative embodiment of the present invention, overload signal 112 is an analog signal.

Figure 3:
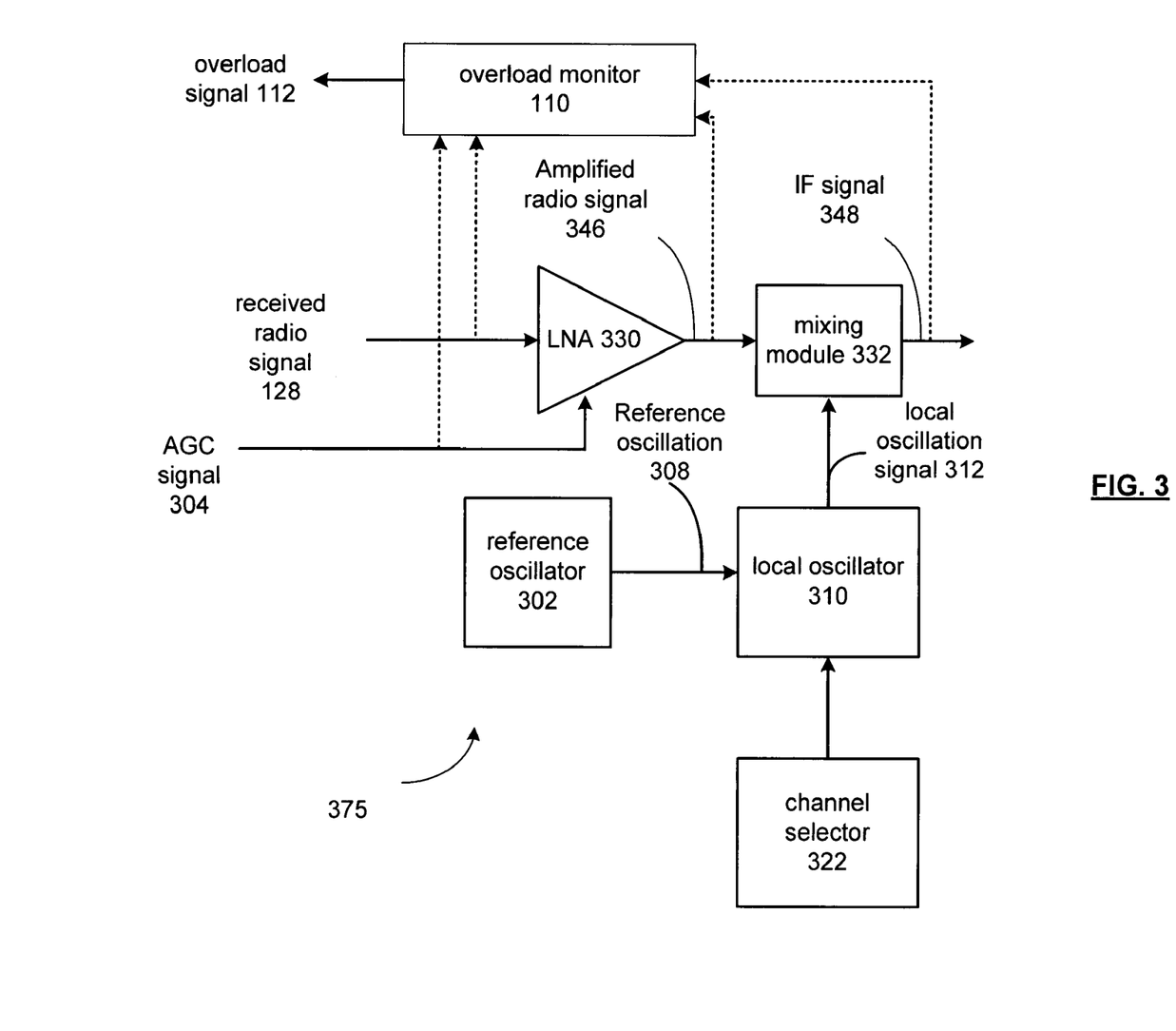
FIG. 3 presents a combination block diagram and schematic diagram of a radio receiver front end in accordance with an embodiment of the present invention.

FIG. 3 presents a combination block diagram and schematic diagram of a radio receiver front end in accordance with an embodiment of the present invention. In particular, a radio receiver front end 375 is shown in one embodiment of a portion of radio stage 102. Radio receiver front end 375 receives a received radio signal 128 having a plurality of channel signals, each of the plurality of channel signals being modulated at one of a corresponding plurality of carrier frequencies. Reference oscillator 302 produces a reference oscillation 308 that is transformed by local oscillator 310 into a local oscillation signal 312 at a local oscillation frequency. A channel selector 322 produces control signal that selects the local oscillation frequency for local oscillator 310 corresponding to a selection of one of the plurality of channels.

Low noise amplifier 330 is an RF amplifier producing an amplified radio signal 346 that is mixed with the local oscillation signal 312 by mixing module 332 to form mixed signal 348 at an intermediate frequency. In a preferred embodiment of the present invention, the gain at which the low noise amplifier 330 amplifies the received radio signal 128 is dependent on the magnitude of automatic gain control (AGC) signal 304 derived from an AGC circuit. Note that mixed signal 348 is a modulated signal and if the local oscillation signal 312 has a frequency that matches the frequency of the selected channel, the mixed signal 348 will have a carrier frequency of approximately zero. If the local oscillation 312 has a frequency that is not equal to the carrier frequency of radio signal 346, then the mixed signal 348 will have a carrier frequency based on the difference between the carrier frequency of the selected channel and the frequency of local oscillation 312. In such a situation, the carrier frequency of the mixed signal 348 may range from 0 hertz to one megahertz or more.

In this embodiment of the present invention, signal parameter 118 is derived from one or more of the AGC signal 304, received radio signal 128, the amplified radio signal 346 and the IF signal 348. It is noted that the AGC signal is operative to control the gain of low noise amplifier 330 to maintain the signal level of amplifier radio signal 346 within an acceptable range. In the presence of a high power received radio signal 128, the AGC signal 304 itself can saturate in an attempt to minimize the gain of low noise amplifier 330. In these circumstances, AGC signal 304 can be used effectively as an indicator of an overload condition in receiver front end 375. In addition to the saturation discussed above, the AGC is a good indication of how close the low noise amplifier is to an overload condition and further the need to mute or attenuate the audio signal.

Figure 4:
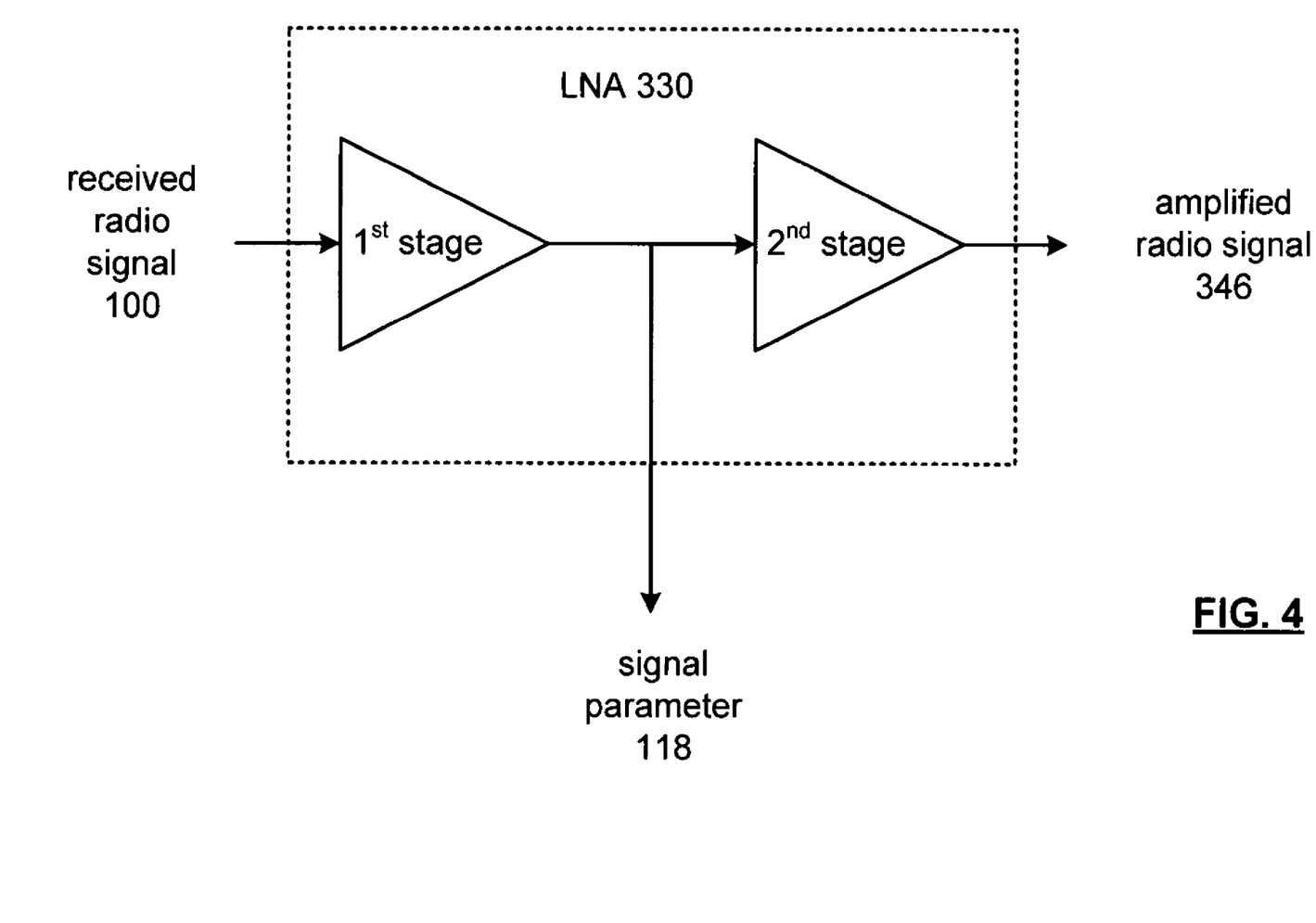
FIG. 4 presents a schematic representation of a low noise amplifier in accordance with an embodiment of the present invention.

FIG. 4 presents a schematic representation of a low noise amplifier in accordance with an embodiment of the present invention. In particular, low noise amplifier 330 has a first stage and a second stage. In this embodiment, the signal parameter 118 is based on the power output of the first stage. This implementation has the advantage that the overload condition can be detected at the earliest portion of the circuit.

Figure 5:
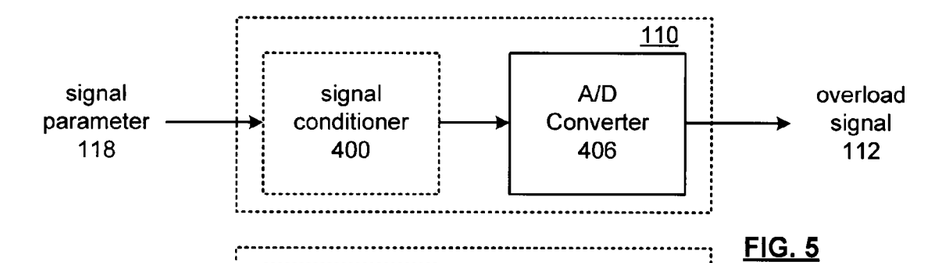
FIGS. 5-7 present combination schematic and block diagram representations of an overload monitor in accordance with embodiments of the present invention.
Figure 6:
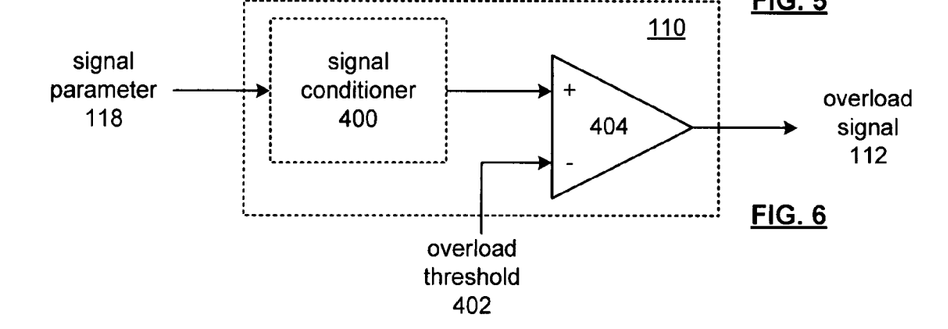
Figure 7:
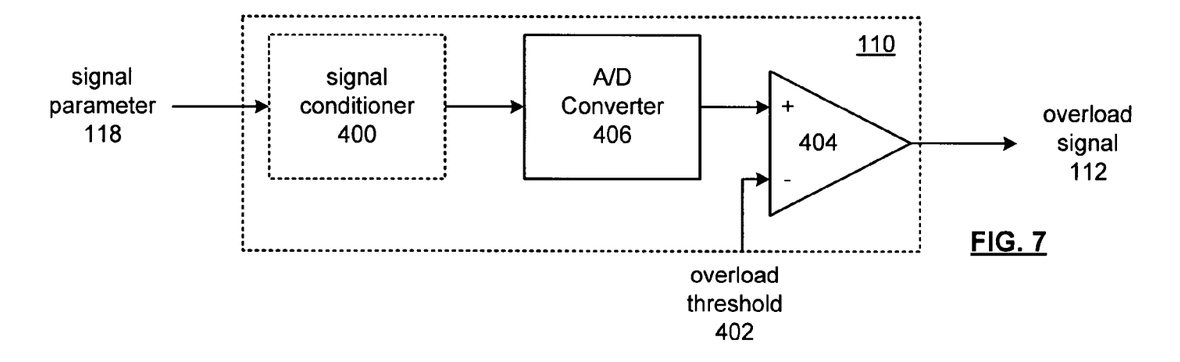

FIGS. 5-7 present combination schematic and block diagram representations of an overload monitor in accordance with embodiments of the present invention. Each embodiment shown includes an optional signal conditioner 400. In an embodiment of the present invention, signal conditioner 400 includes a leaky bucket integrator. This leaky bucket integrator is, in effect, a low-pass filter with very high low frequency gain and a very low cut-off frequency. In operation, the signal conditioner serves to filter out transient overload conditions potentially caused by conditions such as voltage spikes and impulsive noise. Based on the choice of cut-off frequency (and corresponding time constant), the filter reacts only in the presence of a substantial, repetitive or persistent overload conditions. In alternative embodiments of the present invention, other filters including other low pass filters or integrators of first order or of order greater than one, can be implemented in accordance with the broad scope of the present invention.

In FIG. 5, overload monitor 110, includes an A/D converter 406 for converting the optionally conditioned signal parameter 118 into a digital overload signal 112. In this fashion, the magnitude of the overload signal indicates the amount of overload. In FIG. 6, the optionally conditioned signal parameter 118 is converted to a binary representation by comparator 404. Comparator 404 compares this signal to an overload threshold 402 to determine whether or not an overload condition is present. In an embodiment of the present invention, comparator 404 includes a hysteresis band to avoid rapid transitions between an overload and non-overload condition in the presence of noise, and in situations where the signal parameter 118 stabilizes very near the overload threshold 402. FIG. 7 presents an embodiment of overload monitor 110 whereby the optionally conditioned signal parameter 118 is converted to a digital value prior to comparator 404. In this embodiment, comparator 404 implements a digital compare operation.

Figure 8:
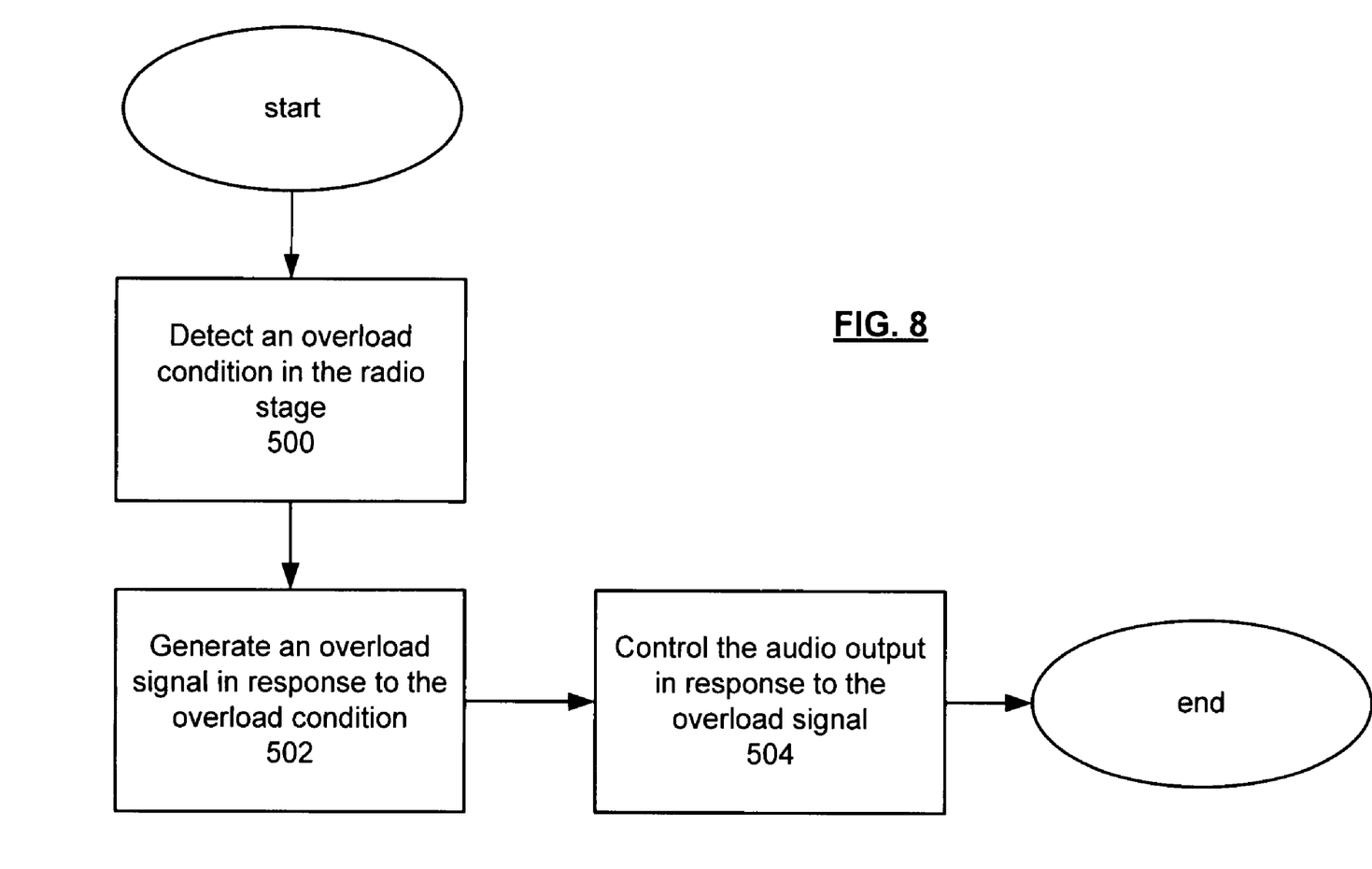
FIG. 8 presents a flowchart representation of a method in accordance with the present invention.

FIG. 8 presents a flowchart representation of a method in accordance with the present invention. In particular, a method for use in a radio receiver is presented that can be used in conjunction with the structure disclosed in FIGS. 1-7. The method begins in step 500 by detecting an overload condition in the radio stage of the radio receiver. In step 502, an overload signal is generated in response to the detected overload condition. In step 504, the audio output is controlled in response to the overload signal.

In an embodiment of the present invention, step 500 optionally includes measuring an analog signal parameter from the radio stage, converting the analog signal parameter to a digital value and comparing the digital value to an overload threshold. Step 502 optionally includes generating the overload signal if the digital value exceeds the overload threshold.

In alternative embodiments of the present invention, step 500 includes one or more of: detecting a saturation condition in the radio stage; or detecting a distortion condition in the radio stage.

In an embodiment wherein the radio stage includes an RF amplifier having a gain that is based on an automatic gain control signal, step 500 can include comparing the automatic gain control signal to an overload threshold, and step 502 can include generating the overload signal if the automatic gain control signal exceeds an overload threshold.

In alternative embodiments of the present invention, step 504 can include muting the audio output, attenuating the audio output, or attenuating the audio output an attenuation amount that is based on the overload signal.

Figure 9:
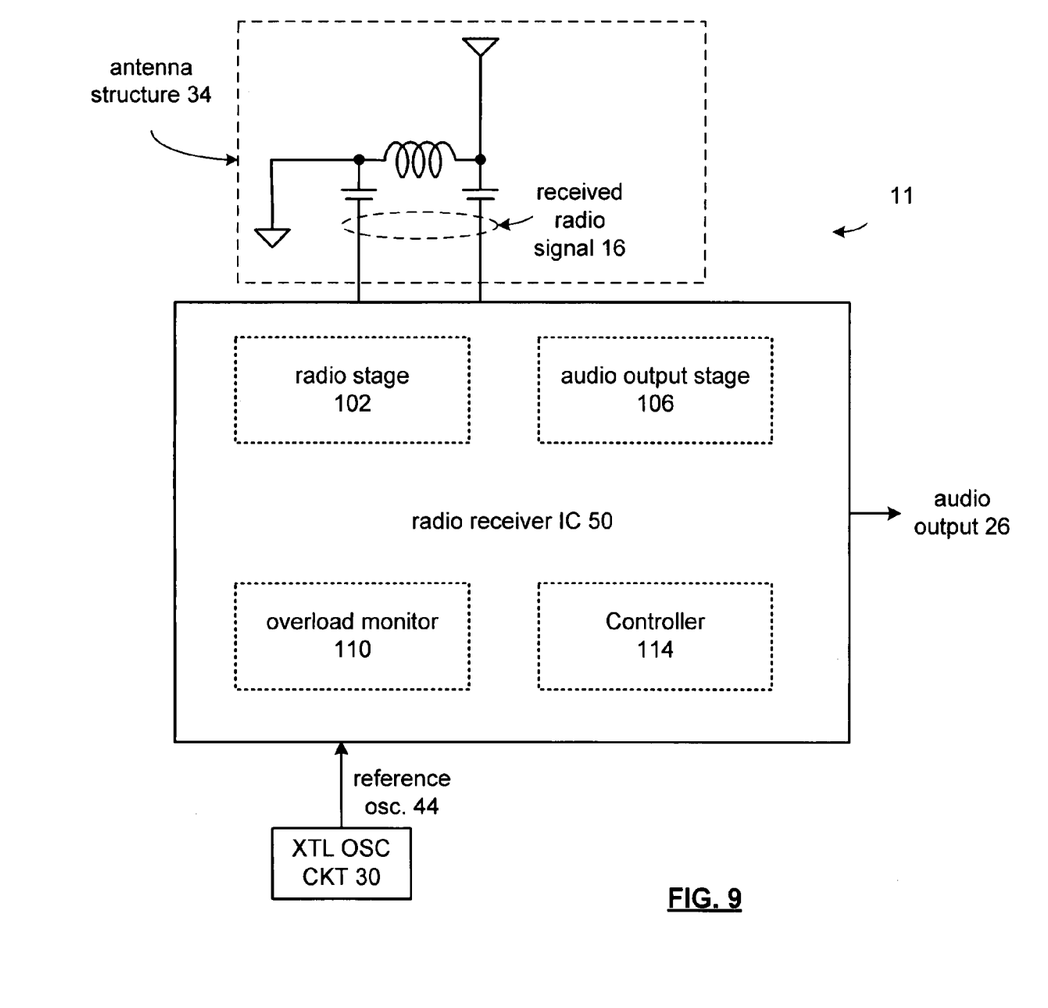
FIG. 9 presents a schematic block diagram of a handheld audio system in accordance with an alternative embodiment of the present invention.

FIG. 9 presents a schematic block diagram of a handheld audio system in accordance with an alternative embodiment of the present invention. In particular, a schematic block diagram of a handheld audio system 11 is presented that includes the functionality of handheld audio system 10 presented in a system on a chip configuration. In this embodiment, the functionality of radio signal decoder IC 12 and digital audio processing IC 14 are incorporated into a single integrated circuit, radio receiver IC 50. In particular, radio receiver IC 50 includes radio stage 102, audio output stage 106, overload monitor 110 and controller 114, and implements the full features and functionality of other embodiments of the present invention described in conjunction with FIGS. 1-8.

In addition to the configurations shown in FIG. 1 and FIG. 9, other configurations that include one or more integrated circuits are possible, as will be understood by one skilled in the art when presented the disclosures herein. The broad scope of the present invention includes other partitioning of the various elements of handheld audio system 11 into one or more integrated circuits.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled". As one of ordinary skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

In preferred embodiments, the various circuit components are implemented using 0.35 micron or smaller CMOS technology. Provided however that other circuit technologies, both integrated or non-integrated, may be used within the broad scope of the present invention. Likewise, various embodiments described herein can also be implemented as software programs running on a computer processor. It should also be noted that the software implementations of the present invention can be stored on a tangible storage medium such as a magnetic or optical disk, read-only memory or random access memory and also be produced as an article of manufacture.

Thus, there has been described herein an apparatus and method, as well as several embodiments including a preferred embodiment, for implementing a radio receiver and handheld audio system. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. A radio receiver comprising:
   a radio stage for processing a received radio signal into an audio signal;
   an audio stage, operably coupled to the radio stage, for producing an audio output based on the audio signal;
   an overload monitor, operably coupled to the radio stage, for detecting an overload condition in the radio stage and, when the overload condition is detected, for generating an overload signal, wherein the overload condition is detected when a strength of the received radio signal exceeds a predetermined amount; and
   a controller, operably coupled to the overload monitor and the audio stage, for controlling the audio output in response to the overload signal, wherein the volume of the audio signal is lowered when the overload condition is detected.

2. The radio receiver of claim 1 wherein the overload monitor measures an analog signal parameter from the radio stage.

3. The radio receiver of claim 2 wherein the overload monitor further includes:
   an analog to digital converter for converting the analog signal parameter to a digital value.

4. The radio receiver of claim 3 wherein the overload monitor further includes:
   a comparator for comparing the digital value to an overload threshold and for generating the overload signal when the digital value compares unfavorably to the overload threshold.

5. The radio receiver of claim 2 wherein the analog signal parameter comprises at least one of a root mean square voltage and a received signal strength indicator.

6. The radio receiver of claim 2 wherein the radio stage includes:
   a radio frequency amplifier, operably coupled to amplify the received radio signal at a gain, wherein the gain is based on an automatic gain control signal.

7. The radio receiver of claim 6 wherein the radio frequency amplifier comprises a first stage and a second stage, wherein the analog signal parameter is based on a power output of the first stage.

8. The radio receiver of claim 7 wherein the overload monitor includes:
   a comparator for comparing the automatic gain control signal to an overload threshold and generating the overload signal when the automatic gain control signal compares unfavorably to the overload threshold.

9. The radio receiver of claim 1 wherein the overload monitor detects at least one of a saturation condition and a distortion condition in the radio stage.

10. The radio receiver of claim 1 wherein the controller controls the audio output for a predetermined period of time.

11. The radio receiver of claim 1 wherein the controller performs at least one of: muting the audio output in response to the overload signal; attenuating the audio output in response to the overload signal; and attenuating the audio output an attenuation amount that is based on the overload signal.

12. The radio receiver of claim 1 wherein at least one of: the radio stage, and the audio stage, are included in a system on a chip integrated circuit.

13. A handheld audio system comprising:
   a radio signal decoder integrated circuit (IC) that produces a digital stereo signal from a received radio signal, wherein the radio signal decoder IC includes an overload monitor for detecting an overload condition and, when the overload condition is detected, for generating an overload signal, wherein the overload condition is detected when a strength of the received radio signal exceeds a predetermined amount; and
   a digital audio processing integrated circuit operably coupled to the radio signal decoder integrated circuit, the digital audio processing integrated circuit including a processing module that is operable to:
      process audio signals for audio playback from at least one of the digital stereo signal and a stored digital audio file; and control the audio playback in response to the overload signal such that the volume of the audio playback is lowered when the overload signal is detected.

14. The handheld audio system of claim 13 wherein the radio signal decoder integrated circuit further includes:
   a radio frequency amplifier for amplifying the received radio signal; and
   an analog to digital converter for converting an analog signal parameter of the radio frequency amplifier to a digital value.

15. The handheld audio system of claim 14 wherein the radio signal decoder integrated circuit communicates the digital value to the digital audio processing integrated circuit.

16. The handheld audio system of claim 15 wherein the digital audio processing integrated circuit compares the digital value to an overload threshold and generates the overload signal when the digital value compares unfavorable to the overload threshold.

17. The handheld audio system of claim 14 wherein the analog signal parameter is at least one of: a root mean square voltage and a received signal strength indicator.

18. The handheld audio system of claim 14 wherein the radio frequency amplifier comprises a first stage and a second stage and wherein the analog signal parameter is based on an output of the first stage.

19. The handheld audio system of claim 13 wherein digital audio processing integrated circuit is further operable to perform at least one of: muting the audio playback in response to the overload signal; attenuating a signal strength of the audio playback in response to the overload signal; and attenuating the signal strength an attenuation amount that is based on the overload signal.

20. The handheld audio system of claim 13 wherein digital audio processing integrated circuit is further operable to control the audio output for a predetermined period of time.

21. A method for use in a radio receiver, the radio receiver including a radio stage for processing a received radio signal into an audio signal and an audio output stage for producing an audio output based on the audio signal, the method comprising the steps of:
   detecting an overload condition in the radio stage to produce a detected overload condition, when a strength of the received radio signal exceeds a predetermined amount;
   generating an overload signal in response to the detected overload condition; and
   controlling the audio output in response to the overload signal such that a volume of audio playback is lowered when the overload signal is generated.

22. The method of claim 21 wherein the step of detecting an overload condition includes measuring an analog signal parameter from the radio stage.

23. The method of claim 22 wherein the step of detecting an overload condition includes converting the analog signal parameter to a digital value.

24. The method of claim 23 wherein the step of detecting an overload condition includes comparing the digital value to an overload threshold.

25. The method of claim 24 wherein the step of generating an overload signal includes generating the overload signal when the digital value compares unfavorably to the overload threshold.

26. The method of claim 22 wherein the analog signal parameter includes at least one of: a root mean square voltage; and, a received signal strength indicator.

27. The method of claim 21 wherein the step of detecting includes at least one of: detecting a saturation condition in the radio stage; and, detecting a distortion condition in the radio stage.

28. The method of claim 21 wherein the radio stage includes a radio frequency amplifier, operably coupled to amplifier the received radio signal at a gain that is based on an automatic gain control signal, wherein the step of detecting an overload condition includes comparing the automatic gain control signal to an overload threshold, and wherein the step of generating an overload signal includes generating the overload signal when the automatic gain control signal compares unfavorably to the overload threshold.

29. The method of claim 21 wherein the step of controlling the audio output includes at least one of: muting the audio output; attenuating the audio output; and, attenuating the audio output an attenuation amount that is based on the overload signal.

30. The method of claim 21 wherein the step of controlling the audio output includes controlling the audio output for a predetermined period of time.

* * * * *